United States Patent
Chiu

(10) Patent No.: US 7,068,019 B1
(45) Date of Patent: Jun. 27, 2006

(54) SWITCHABLE LINEAR REGULATOR

(75) Inventor: Chi-Kun Chiu, Pingzhen (TW)

(73) Assignee: Mediatek Inc., Hsinchu (TW)

( * ) Notice: Subject to any disclaimer, the term of this patent is extended or adjusted under 35 U.S.C. 154(b) by 0 days.

(21) Appl. No.: 11/087,464

(22) Filed: Mar. 23, 2005

(51) Int. Cl.
*G05F 1/56* (2006.01)

(52) U.S. Cl. ...................... 323/281; 323/273

(58) Field of Classification Search ........... 323/273, 323/274, 279, 281, 353, 354
See application file for complete search history.

(56) References Cited

U.S. PATENT DOCUMENTS

| | | | | |
|---|---|---|---|---|
| 4,495,472 A | * | 1/1985 | Dwarakanath | 330/277 |
| 4,810,948 A | * | 3/1989 | Takuma | 323/280 |
| 5,231,316 A | * | 7/1993 | Thelen, Jr. | 327/103 |
| 5,467,009 A | * | 11/1995 | McGlinchey | 323/269 |
| 6,583,607 B1 | * | 6/2003 | Marty et al. | 323/273 |
| 6,593,607 B1 | | 7/2003 | Hseih | 257/292 |

* cited by examiner

*Primary Examiner*—Gary L Laxton
(74) *Attorney, Agent, or Firm*—Thomas, Kayden, Horstemeeyer & Risley

(57) ABSTRACT

A switchable linear regulator. The switchable linear regulator comprises a constant voltage source, a differential amplifier, a pass transistor, a first resistor, a plurality of second resistors and a plurality of switches. The differential amplifier has a first input terminal coupled to the constant voltage source and a second input terminal connected to a first node. The pass transistor has a first terminal controlled by the differential amplifier, a second terminal coupled to a supply voltage, and a third terminal connected to a second node. The first resistor is connected between the first and second nodes. Each second resistor comprises one end connected to the first node. Each switch is coupled between the other end of a corresponding second resistor and the ground.

7 Claims, 7 Drawing Sheets

U.S. Pat. No. 7,068,019 B1

SWITCHABLE LINEAR REGULATOR

BACKGROUND

The invention relates to a linear regulator and, in particular, to a linear regulator providing a selectable output voltage.

FIG. 1 shows a conventional linear regulator commonly used by those skilled in the art. The bandgap reference circuit provides a stable voltage $V_{bg}$. Noise of the voltage $V_{bg}$ is filtered out by a low pass filter typically comprising an on-chip resistor $R_{bg}$ and an off-chip capacitor $C_{bp}$. The filtered signal $V_{ref}$ is sent to a first input terminal of an error amplifier. In the example shown in FIG. 1, the error amplifier is an operational amplifier and the first input terminal is the negative input of the operational amplifier. A second input, which is the positive input, of the operation amplifier is connected to a first node. A PMOS pass transistor $M_A$ is controlled by an output of the error amplifier. As shown in FIG. 1, a drain of the pass transistor $M_A$ is treated as the output terminal of the linear regulator. In order to guarantee the output stability of the linear regulator, a large external capacitor $C_{OUT}$ is typically connected to the output terminal. A first feedback resistor $R_1$ is connected between the drain of the pass transistor $M_A$ and the first node. A second feedback resistor $R_2$ is connected between the first node and the ground. Based on the virtual short between the input terminals of the error amplifier, an output voltage $V_{OUT}$ of the regulator can be adjusted by the ratio of the feedback resistors $R_1$ and $R_2$. As is known in the art, the output voltage $V_{OUT}$ is determined according to the voltage signal $V_{ref}$, the first and second feedback resistors $R_1$ and $R_2$, and is obtained by $$V_{OUT} = V_{ref} \times \left(1 + \frac{R_1}{R_2}\right).$$

For some applications, multiple regulator output voltages are needed. FIG. 2 shows a conventional linear regulator which provides multiple output voltages. As shown in FIG. 2, a bandgap reference circuit is shared by two error amplifiers to reduce the required chip area. The external capacitor $C_{bp}$ is also typically shared such that the number of pins and external components can be minimized. Two sets of error amplifiers (error amplifiers A and B) and pass transistors ($M_A$ and $M_B$) are used and different feedback resistor ratios are provided to generate different output voltages. According to FIG. 2, the output voltages $V_{OUTA}$ and $V_{OUTB}$ can be found to be $$V_{OUTA} = V_{ref} \times \left(1 + \frac{R_{A1}}{R_{A2}}\right)$$

and $$V_{OUTB} = V_{ref} \times \left(1 + \frac{R_{B1}}{R_{B2}}\right),$$

respectively.

A linear regulator with a selectable output voltage is disclosed in U.S. Pat. No. 6,593,607 by Nicolas Marty et. al.

As shown in FIG. 3, the linear regulator comprises a power MOS transistor 2 controlled by a differential amplifier 5. The differential amplifier 5 has an input terminal 8 receiving, via a circuit of resistors $R_1$, $R_2$, $R_3$ switchable by means of MOS control transistors 12 and 14, a voltage proportional to the output voltage $V_{OUT}$ provided by the regulator. The regulator further includes at least two circuits for generating the control signals CTRL1 and CTRL2 for controlling the respective gates of the control transistors 12 and 14. When the control signals CTRL1 and CTRL2 are respectively at a low and high state, the output voltage $V_{OUT}$ equals $$V_{ref} \times \left(1 + \frac{R_1 + R_2}{R_3}\right).$$

To the contrary, when the signals CTRL1 and CTRL2 are respectively at a high and low state, the output voltage $V_{OUT}$ equals $$V_{ref} \times \left(1 + \frac{R_1}{R_2 + R_3}\right).$$

Theoretically, the desired values of the output voltage $V_{OUT}$ can always be achieved by arbitrarily setting the values of the resistors $R_1$, $R_2$, and $R_3$. However, in practical, the values of these resistors cannot be arbitrary ones in consideration of layout matching as well as the output voltage accuracy. This fact makes the choice of the resistors become difficult, especially when the desired levels of the output voltage is more than two, in a design based on the one shown in FIG. 3.

SUMMARY

An embodiment of a switchable linear regulator for providing a selectable output voltage comprises a constant voltage source, a differential amplifier, a pass element transistor, a first resistor, a plurality of second resistors and a plurality of switches. The differential amplifier has a first input terminal coupled to the constant voltage source and a second input terminal connected to a first node. The pass element transistor has a first terminal controlled by the differential amplifier and a second terminal connected to a supply voltage. The first resistor is connected between the pass transistor and the first node. Each second resistor comprises one end connected to the first node. Each switch is coupled between the other end of a corresponding second resistor and a fixed voltage.

DETAILED DESCRIPTION

Figure 4:
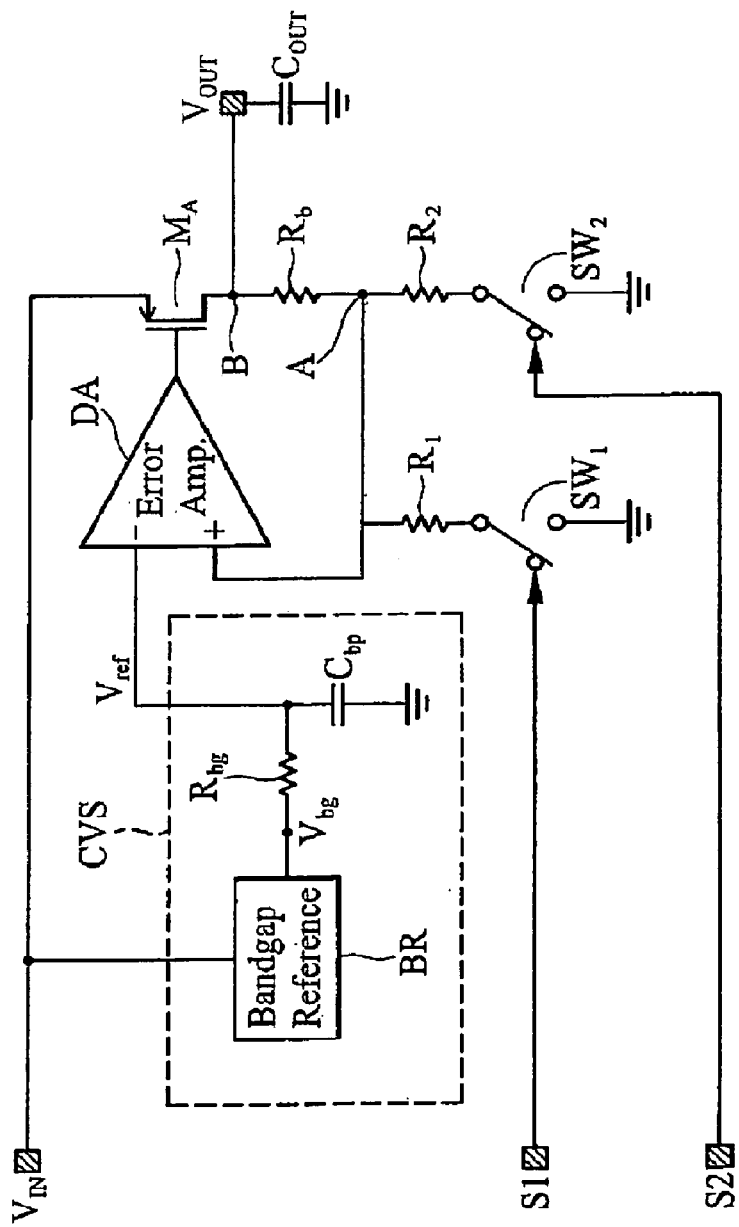
FIG. 4 shows a circuit diagram of a switchable linear regulator according to an embodiment of the invention.

FIG. 4 shows a circuit diagram of a switchable linear regulator according to an embodiment of the invention. The switchable linear regulator comprises a constant voltage source CVS, a differential amplifier DA, a pass transistor $M_A$, a first resistor $R_b$, two second resistors $R_1$, $R_2$, a first switch $SW_1$, and a second switch $SW_2$. The constant voltage source CVS provides a constant voltage $V_{ref}$ to a first input terminal of the differential amplifier DA. A second input terminal of the differential amplifier DA is coupled to a first node A. A first terminal of the pass transistor $M_A$ is controlled by the differential amplifier DA. A second and third terminal of the pass transistor $M_A$ is respectively coupled to a supply voltage $V_{IN}$ and the second node B. The output terminal $V_{OUT}$ is coupled to the second node B. Preferably, the pass transistor $M_A$ is a PMOS transistor and the first and second input terminals of the differential amplifier DA are respectively the negative and positive input. A first resistor $R_b$ is connected between the first node A and second node B. Each of the second resistors $R_1$, $R_2$ has one end connected to the first node A. The first switch $SW_1$ is coupled between the other end of the second resistor $R_1$ and a fixed voltage, and is controlled by a first control signal S1. The second switch $SW_2$ is coupled between the other end of the second resistor $R_2$ and the fixed voltage, and is controlled by a second control signal S2. Preferably, the fixed voltage is a ground.

More specifically, the constant voltage source CVS of the switchable linear regulator comprises a bandgap reference circuit BR coupled to the supply voltage $V_{IN}$. Furthermore, the constant voltage source CVS may comprise a RC low pass filter connected between the first input terminal of the differential amplifier DA and the bandgap reference circuit BR. The bandgap reference circuit BR provides a stable voltage $V_{bg}$. Noise of the voltage $V_{bg}$ is filtered out by a low pass filter comprising a resistor $R_{bg}$ and a capacitor $C_{bp}$. The filtered signal $V_{ref}$ is a constant voltage and sent to the first input terminal of the differential amplifier DA.

Moreover, the switchable linear regulator may comprise a capacitor $C_{OUT}$ coupled between the output terminal and the fixed voltage. The capacitor $C_{OUT}$ improves stability of the output voltage $V_{OUT}$ of the switchable linear regulator.

Figure 1:
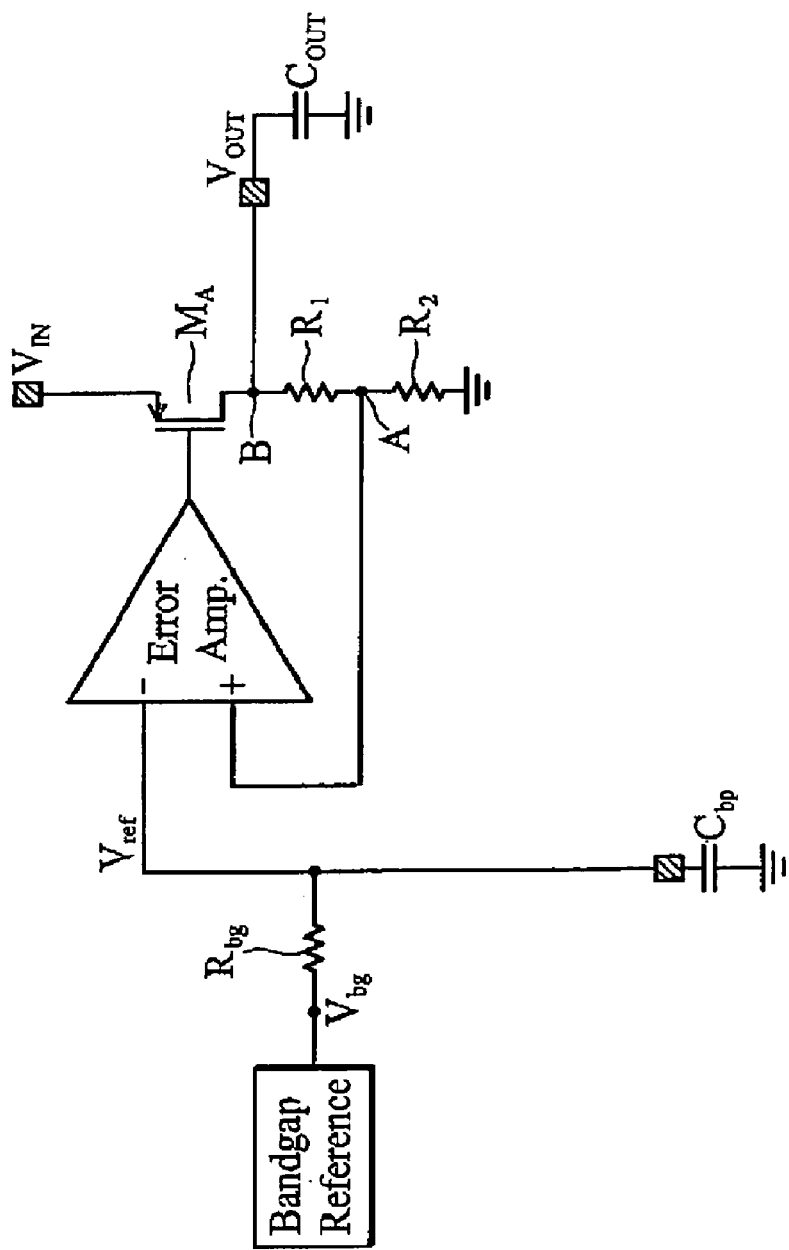
FIG. 1 shows a conventional liner regulator commonly used by those skilled in the art.
Figure 2:
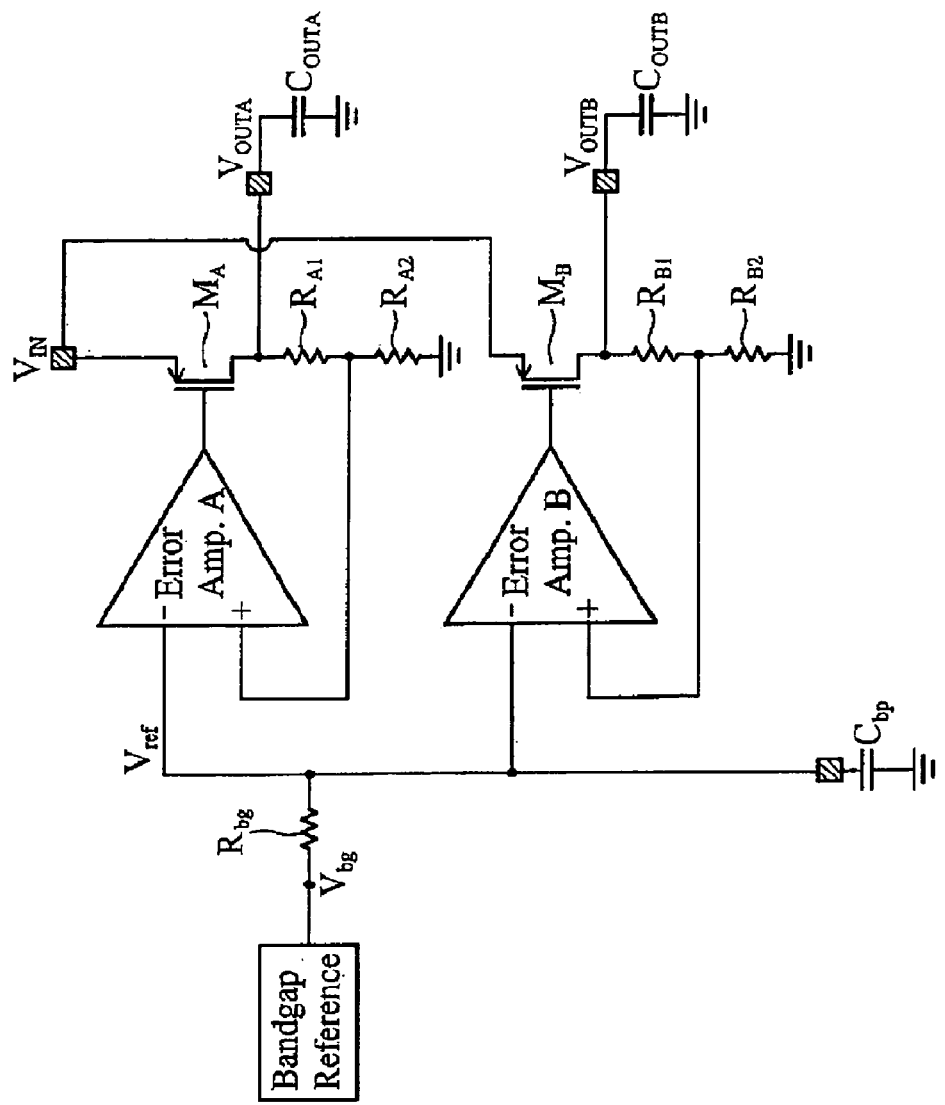
FIG. 2 shows a conventional linear regulator which provides multiple output voltages.
Figure 5:
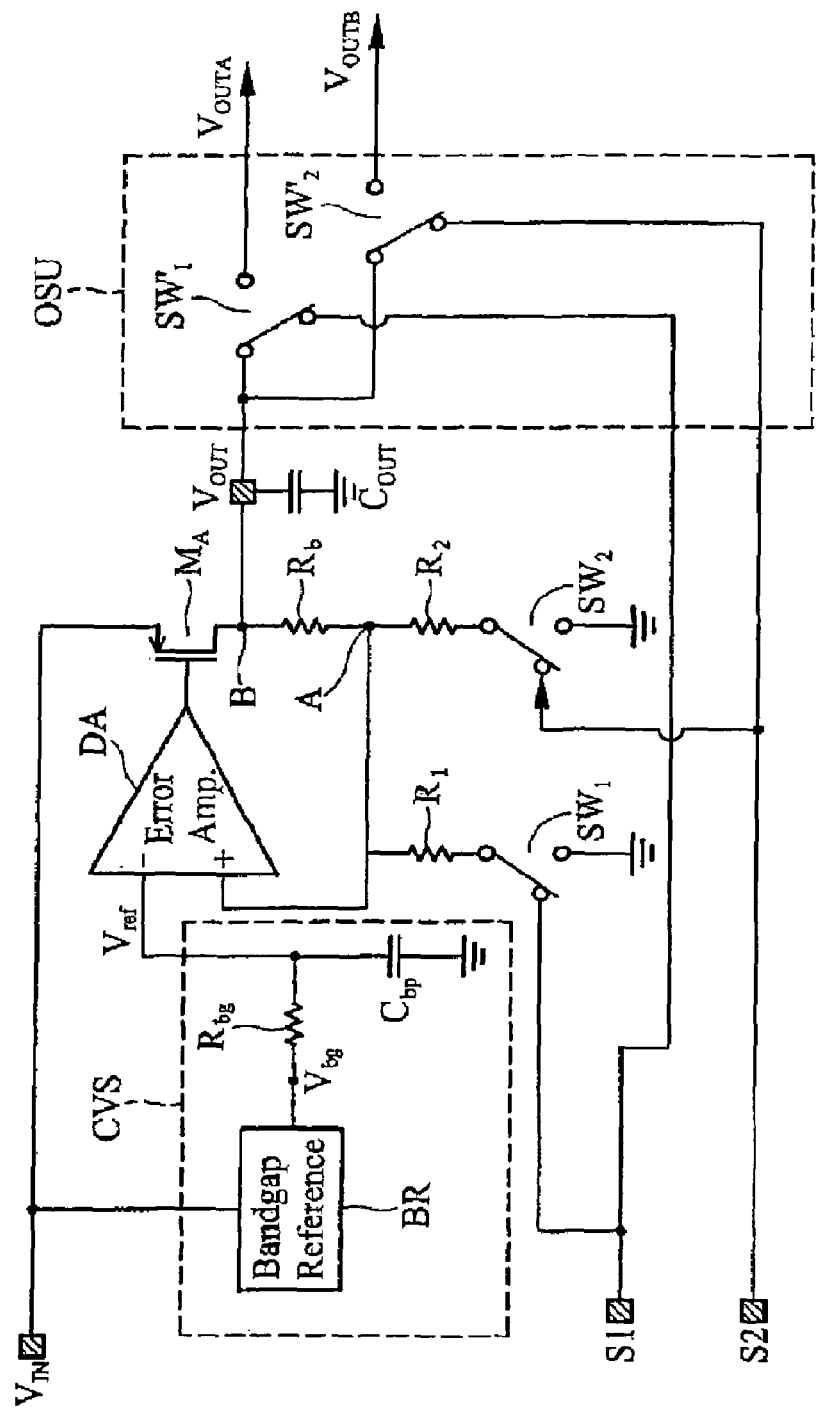
FIG. 5 shows a circuit diagram of a switchable linear regulator derived from that shown in FIG. 4.

FIG. 5 shows a circuit diagram of a switchable linear regulator derived from the one shown in FIG. 4. The switchable linear regulator further comprises an output switch unit OSU having an input and a plurality of outputs. The output switch unit OSU is controlled by the first and second control signals S1 and S2 for selectively connecting one of the plurality of outputs to the input such that the output terminal of the switchable linear regulator is further selectable according to the control signals S1 and S2. In the example shown in FIG. 5, the output switch unit OSU is employed to make the terminal $V_{OUTA}$ as the active output terminal of the switchable linear regulator when the first control signal S1 triggers the first switch SW1 to be ON state; and make the terminal $V_{OUTB}$ as the active output terminal of the switchable linear regulator when the second control signal S2 triggers the second switch SW2 to be ON state. In such an example, the output switch unit OSU contains a first output switch $SW'_1$ and a second output switch $SW'_2$ both connected to the input, i.e. the second node B. The first output switch $SW'_1$ is connected between the second node B and the output terminal $V_{OUTA}$, and is controlled by the first control signal S1. The first control signal S1 that triggers the first switch SW1 to be ON state will also trigger the first output switch $SW'_1$ to be ON state. The second output switch $SW'_2$ is connected between the second node B and the output terminal $V_{OUTB}$. The second control signal S2 that triggers the second switch SW2 to be ON state will also trigger the second output switch $SW'_2$ to be ON state. Compared with the linear regulator shown in FIG. 2, one differential amplifier and one pass transistor are eliminated in the circuitry of the switchable linear regulator. Thus, the chip area can be reduced and the number of pins and external components is also reduced. When the first control signals S1 triggers the switches $SW_1$ and $SW'_1$ to be ON state and the second control signal S2 triggers the switches SW2 and $SW'_2$ to be OFF state, $V_{OUT}$ equals $$V_{ref} \times \left(1 + \frac{R_b}{R_1}\right)$$

and the active output terminal of the switchable linear regulator is $V_{OUTA}$. On the contrary, when the first control signals S1 triggers the switches $SW_1$ and $SW'_1$ to be OFF state and the second control signal S2 triggers the switches SW2 and $SW'_2$ to be ON state, $V_{OUT}$ equals $$V_{ref} \times \left(1 + \frac{R_b}{R_2}\right)$$

and the active output terminal of the switchable linear regulator is $V_{OUTB}$. In this embodiment, the switchable linear regulator provides a selectable output voltage as well as a selectable output terminal. Meanwhile, the chip area and the number of pins and external components are minimized.

Figure 3:
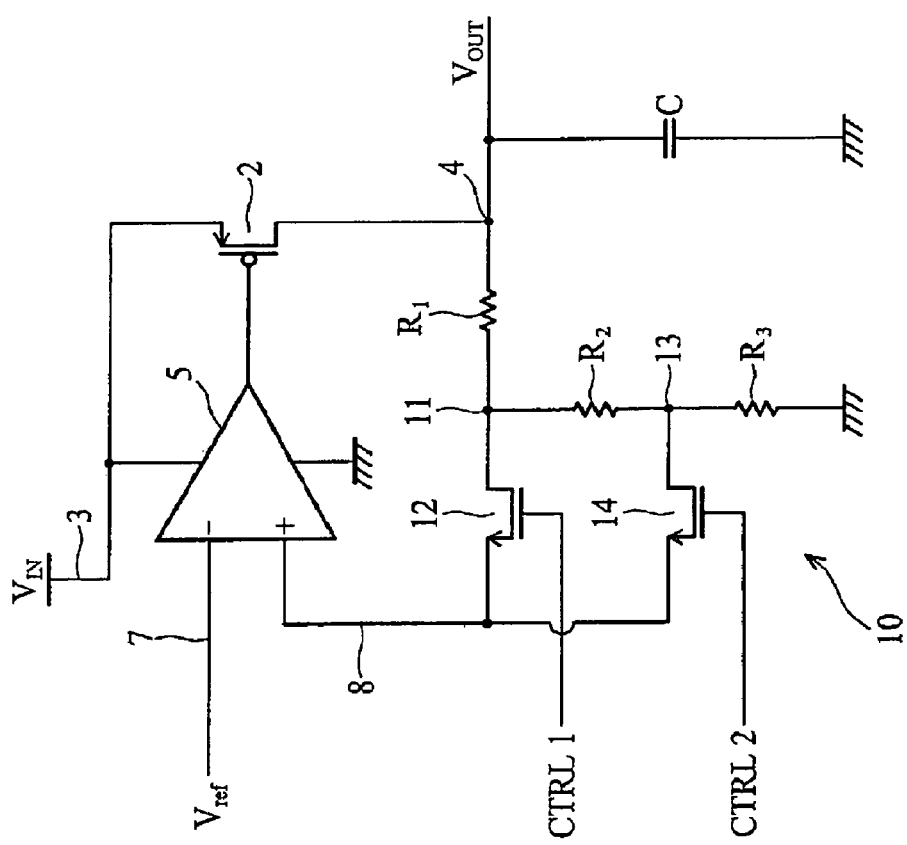
FIG. 3 shows a linear regulator with a selectable output voltage disclosed in U.S. Pat. No. 6,593,607 by Nicolas Marty et. al.

In order to provide an accurate output voltage, matching of the feedback resistors is typically a major concern in a regulator design. Utilization of unit cells to implement feedback resistors and inter-digitized layout improves matching thereof. In other words, the selected feedback resistor values need to have a reasonable common divisor for convenience of layout. Take a linear regulator with two selectable output voltages as an example. In FIG. 3, the design equations are respectively $$V_{OUT} = V_{ref} \times \left(1 + \frac{R_1 + R_2}{R_3}\right)$$

and $$V_{OUT} = V_{ref} \times \left(1 + \frac{R_1}{R_2 + R_3}\right).$$

Both equations are functions of the same three design variables and closely related to one another. In FIG. 4, however, the design equations are respectively $$V_{OUT} = V_{ref} \times \left(1 + \frac{R_b}{R_1}\right)$$

and $$V_{OUT} = V_{ref} \times \left(1 + \frac{R_b}{R_2}\right).$$

As long as the value of resistor $R_b$ is chosen, $R_1$ and $R_2$ can be determined according to the output voltage $V_{OUT}$ and the constant voltage $V_{ref}$. Thus, the regulator design is simplified.

Figure 6:
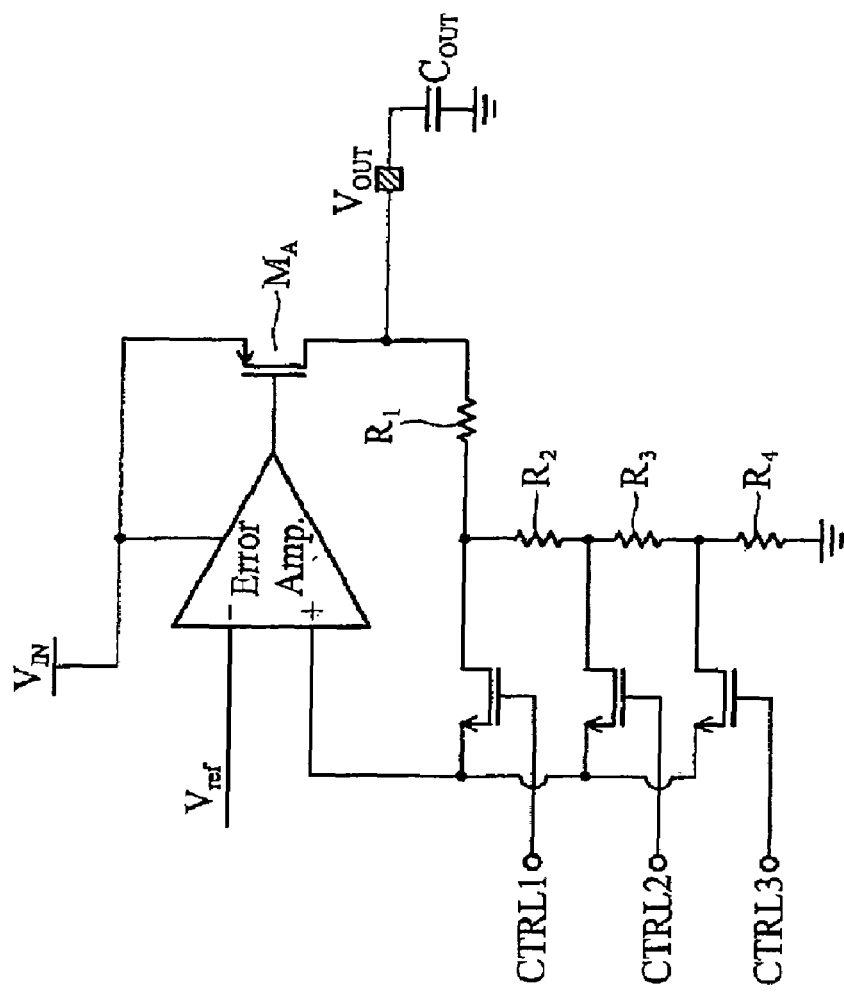
FIG. 6 shows a circuit diagram of a linear regulator with a selectable output voltage derived from U.S. Pat. No. 6,593,607.

However, when more selectable output voltages are required, the design of the invention is much simplified as compared with the conventional regulators. If three output voltages are required, the regulator in FIG. 3 is expanded to the one shown in FIG. 6. The design equations are shown as follows, $CTRL1$ = low, $CTRL2$ = low,
$$CTRL3 = \text{high} \rightarrow V_{OUT} = V_{ref} \times \left(1 + \frac{R_1 + R_2 + R_3}{R_4}\right)$$
$CTRL1$ = low, $CTRL2$ = high,
$$CTRL3 = \text{low} \rightarrow V_{OUT} = V_{ref} \times \left(1 + \frac{R_1 + R_2}{R_3 + R_4}\right)$$
$CTRL1$ = high, $CTRL2$ = low,
$$CTRL3 = \text{low} \rightarrow V_{OUT} = V_{ref} \times \left(1 + \frac{R_1}{R_2 + R_3 + R_4}\right).$$

Figure 7:
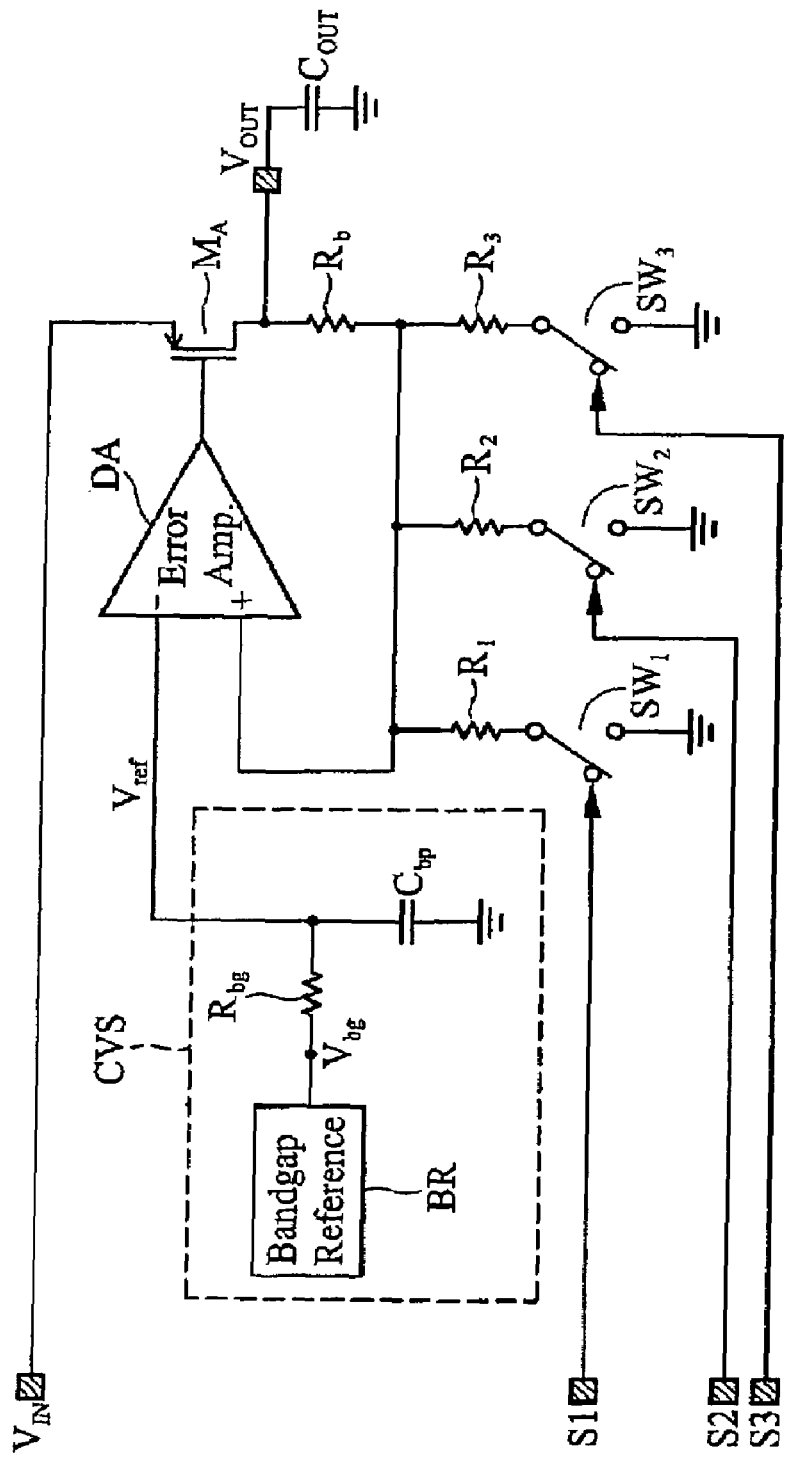
FIG. 7 shows a circuit diagram of a switchable linear regulator according to an embodiment of the invention.

When the same output voltages are implemented in the invention, the circuit diagram is shown in FIG. 7. The design equations are shown as follows, $$S1 = \text{high}, S2 = \text{low}, S3 = \text{low} \rightarrow V_{OUT} = V_{ref} \times \left(1 + \frac{R_b}{R_1}\right)$$
$$S1 = \text{low}, S2 = \text{high}, S3 = \text{low} \rightarrow V_{OUT} = V_{ref} \times \left(1 + \frac{R_b}{R_2}\right)$$
$$S1 = \text{low}, S2 = \text{low}, S3 = \text{high} \rightarrow V_{OUT} = V_{ref} \times \left(1 + \frac{R_b}{R_3}\right).$$

It is clear that the design equations of the invention are simpler than the conventional regulators. Although only one case is given as an example to demonstrate the advantage of the invention. Its applicability to other circumstances is readily apparent. It is assumed that $V_{ref}$=1.2 V and the three output voltages are respectively 2.8 V, 2 V and 1.4 V. According to the invention, it is very easy to obtain a suitable combination of the resistors $R_b$=40 kΩ, $R_1$=30 kΩ, $R_2$=60 kΩ and $R_3$=240 kΩ.

A unit cell of 10 kΩ or 20 kΩ can be used to realize the resistor layouts. To the contrary, the design of the conventional regulator is more complicated while practically implementing it. From the design equations, it is found that $5R_3$=$2R_4$, $9R_1$=$5R_2$ and $3R_1$=$R_4$. Thus, a solution of $R_1$=30 Ω, $R_2$=54 kΩ, $R_3$=4 kΩ and $R_4$=10 kΩ can be derived. Apparently, it is more difficult to find a suitable common divisor as a layout unit cell.

While the invention has been described by way of examples and in terms of preferred embodiment, it is to be understood that the invention is not limited thereto. To the contrary, it is intended to cover various modifications and the advantages would be apparent compared to those skilled in the art. Therefore, the scope of the appended claims should be accorded the broadest interpretation so as to encompass all such modifications.

What is claimed is:

1. A switchable linear regulator for providing a selectable output voltage, the switchable linear regulator comprising:
    a constant voltage source;
    a differential amplifier having a first input terminal coupled to the constant voltage source and a second input terminal connected to a first node;
    a transistor with a first terminal controlled by the differential amplifier and a second terminal coupled to a supply voltage and a third terminal connected to a second node;
    a first resistor connected between the first and second nodes;
    a plurality of second resistors, each comprising one end connected to the first node; and
    a plurality of switches, each coupled between the other end of the corresponding second resistor and a fixed voltage and controlled by a corresponding control signal;
    wherein the voltage at the second node is output as the output voltage which is selectable according to the control signals.

2. The switchable linear regulator as claimed in claim 1, wherein the switchable linear regulator has an output terminal coupled to the second node and further comprises a capacitor coupled between the output terminal and the fixed voltage.

3. The switchable linear regulator as claimed in claim 1, wherein the fixed voltage is a ground.

4. The switchable linear regulator as claimed in claim 1, wherein the constant voltage source comprises a bandgap reference circuit coupled to the supply voltage.

5. The switchable linear regulator as claimed in claim 4, wherein the constant voltage source further comprises a low pass filter coupled between the first input terminal of the differential amplifier and the bandgap reference circuit.

6. The switchable linear regulator as claimed in claim 1, further comprising an output switch unit having an input terminal, coupled to the second node, and a plurality of output terminals, wherein the output switch unit is controlled by the plurality of control signals for selectively connecting one of the plurality of output terminals to the input terminal and the selected output terminal of the output switch acts as an output terminal of the switchable linear regulator such that the output terminal of the switchable linear regulator are further selectable according to the control signals.

7. The switchable linear regulator as claimed in claim 1, wherein the transistor is a PMOS transistor.

* * * * *